(12) United States Patent
Hoang

(10) Patent No.: US 10,692,546 B2
(45) Date of Patent: Jun. 23, 2020

(54) METHOD FOR PROGRAMMING A MEMORY CIRCUIT WITH A VERIFICATION PROCESS

(71) Applicant: eMemory Technology Inc., Hsin-Chu (TW)

(72) Inventor: Dung Le Tan Hoang, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 16/285,218

(22) Filed: Feb. 26, 2019

(65) Prior Publication Data

US 2019/0325977 A1 Oct. 24, 2019

Related U.S. Application Data

(60) Provisional application No. 62/659,150, filed on Apr. 18, 2018.

(51) Int. Cl.
| | |
|---|---|
| *G11C 17/00* | (2006.01) |
| *G11C 7/06* | (2006.01) |
| *G11C 7/12* | (2006.01) |
| *G11C 5/14* | (2006.01) |
| *G11C 17/16* | (2006.01) |
| *G11C 17/18* | (2006.01) |
| *H01L 21/28* | (2006.01) |

(Continued)

(52) U.S. Cl.
CPC .............. *G11C 7/065* (2013.01); *G11C 5/147* (2013.01); *G11C 7/08* (2013.01); *G11C 7/12* (2013.01); *G11C 17/16* (2013.01); *G11C 17/18* (2013.01); *H01L 27/11517* (2013.01); *H01L 29/40114* (2019.08); *H01L 29/40117* (2019.08)

(58) Field of Classification Search
CPC ..... G11C 16/0483; G11C 16/26; G11C 16/10; G11C 16/08; G11C 16/3459; G11C 11/5628; G11C 11/5671; G11C 16/14; G11C 7/12; G11C 16/24; G11C 16/30; G11C 11/5642; G11C 16/0466
USPC ....... 365/154, 194, 203, 189.05, 205, 49.17, 365/189.17, 210.1
See application file for complete search history.

(56) References Cited

U.S. PATENT DOCUMENTS

| | | |
|---|---|---|
| 7,176,864 B2 | 2/2007 | Moriyama |
| 7,271,808 B2 | 9/2007 | Moriyama |
| 7,920,417 B2 | 4/2011 | Seo |

(Continued)

FOREIGN PATENT DOCUMENTS

| | | |
|---|---|---|
| CN | 101887745 A | 11/2010 |
| TW | 573288 | 1/2004 |

(Continued)

*Primary Examiner* — Thong Q Le
(74) *Attorney, Agent, or Firm* — Winston Hsu

(57) ABSTRACT

A memory circuit includes a memory cell, a first program driver, a second program driver, and a sensing amplifier. A method for operating the memory circuit includes, during a program operation of the memory cell, providing a program voltage to the memory cell, enabling the first program driver to drive the first local bit line to be at a low voltage, enabling the second program driver, disabling the first program driver, and enabling the sensing amplifier to verify whether the first memory cell has been programmed or not. The second program driver has a weaker driving ability than the first program driver.

12 Claims, 3 Drawing Sheets

(51) Int. Cl.
 *H01L 27/11517* (2017.01)
 *G11C 7/08* (2006.01)

(56) References Cited

U.S. PATENT DOCUMENTS

| | | | |
|---|---|---|---|
| 2010/0011266 A1 | 1/2010 | Kurjanowicz | |
| 2010/0202183 A1 | 8/2010 | Kurjanowicz | |
| 2014/0016425 A1* | 1/2014 | Lee | G05F 1/10 |
| | | | 365/226 |
| 2018/0068739 A1 | 3/2018 | Shiino | |

FOREIGN PATENT DOCUMENTS

| | | |
|---|---|---|
| TW | 200506810 | 2/2005 |
| TW | 201812766 A | 4/2018 |
| TW | 201812769 A | 4/2018 |

\* cited by examiner

METHOD FOR PROGRAMMING A MEMORY CIRCUIT WITH A VERIFICATION PROCESS

CROSS REFERENCE TO RELATED APPLICATIONS

This non-provisional application claims priority of U.S. provisional application No. 62/659,150, filed on Apr. 18, 2018, included herein by reference in its entirety.

BACKGROUND OF THE INVENTION

1. Field of the Invention

The present invention is related to a memory circuit, and more particularly, to a method for programming the memory circuit with a verification process.

2. Description of the Prior Art

Some of nonvolatile memories are programmed by causing hard breakdown on the gate structures of memory cells with high voltages, so the changes of physical structure can retain the stored data. The memory cell with a hard breakdown gate structure will cause a gate current through the gate, and thus the stored data may be identified later by detecting the intensity of the gate current.

However, due to the characteristic variation among memory cells caused inevitably during the manufacturing process, the program operation may not always be successful at the first time. That is, although most of the memory cells may be hard breakdown in a short time, some memory cells may need more time or more energy to cause hard breakdown.

In prior art, to ensure the data has been programmed to the memory cells, a read operation will be performed every time after the program operation to check if the data stored in the memory is the same as the data to be programmed. If the checking process fails, then the memory cell will be programmed again. However, the repeated program operation can cause degradation to the memory cell, making the memory cell more difficult to be read. Furthermore, since the program operation and the read operation may require different voltages, switching between different voltage supplies for the program operations and the read operations can be a waste of time and power.

SUMMARY OF THE INVENTION

One embodiment of the present invention discloses a memory circuit. The memory circuit includes a memory cell, a first program driver, a second program driver, a sensing amplifier, and a program control circuit.

The memory cell is coupled to a local bit line, and includes a antifuse transistor for receiving a program voltage during a program operation of the memory cell. The first program driver is coupled to the first local bit line. The first program driver drives the first local bit line to be at a low voltage when being enabled during the program operation of the memory cell. The second program driver is coupled to the local bit line. The second program driver drives the first local bit line to be close to the low voltage when being enabled during the program operation of the first memory cell. The second program driver has a weaker driving ability than the first program driver. The sensing amplifier is coupled to the first local bit line. The sensing amplifier verifies whether the memory cell has been programmed or not by comparing a verification reference voltage and a bit line voltage on the local bit line caused by a current generated by the memory cell when being enabled during the program operation of the memory cell.

The program control circuit is coupled to the first program driver, the second program driver, and the sensing amplifier driver. During the program operation, the program control circuit enables the first program driver and the second program driver, disables the first program driver after the first program driver is enabled for a predetermined time, and enables the sensing amplifier after the first program driver is disabled during the program operation.

Another embodiment of the present invention discloses a method for operating a memory circuit. The memory circuit includes a memory cell, a first program driver, a second program driver, and a sensing amplifier.

The method includes during a program operation of the memory cell, providing a program voltage to the memory cell, enabling the first program driver to drive the first local bit line to be at a low voltage, enabling the second program driver, disabling the first program driver, and enabling the sensing amplifier to verify whether the first memory cell has been programmed or not. The second program driver has a weaker driving ability than the first program driver.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
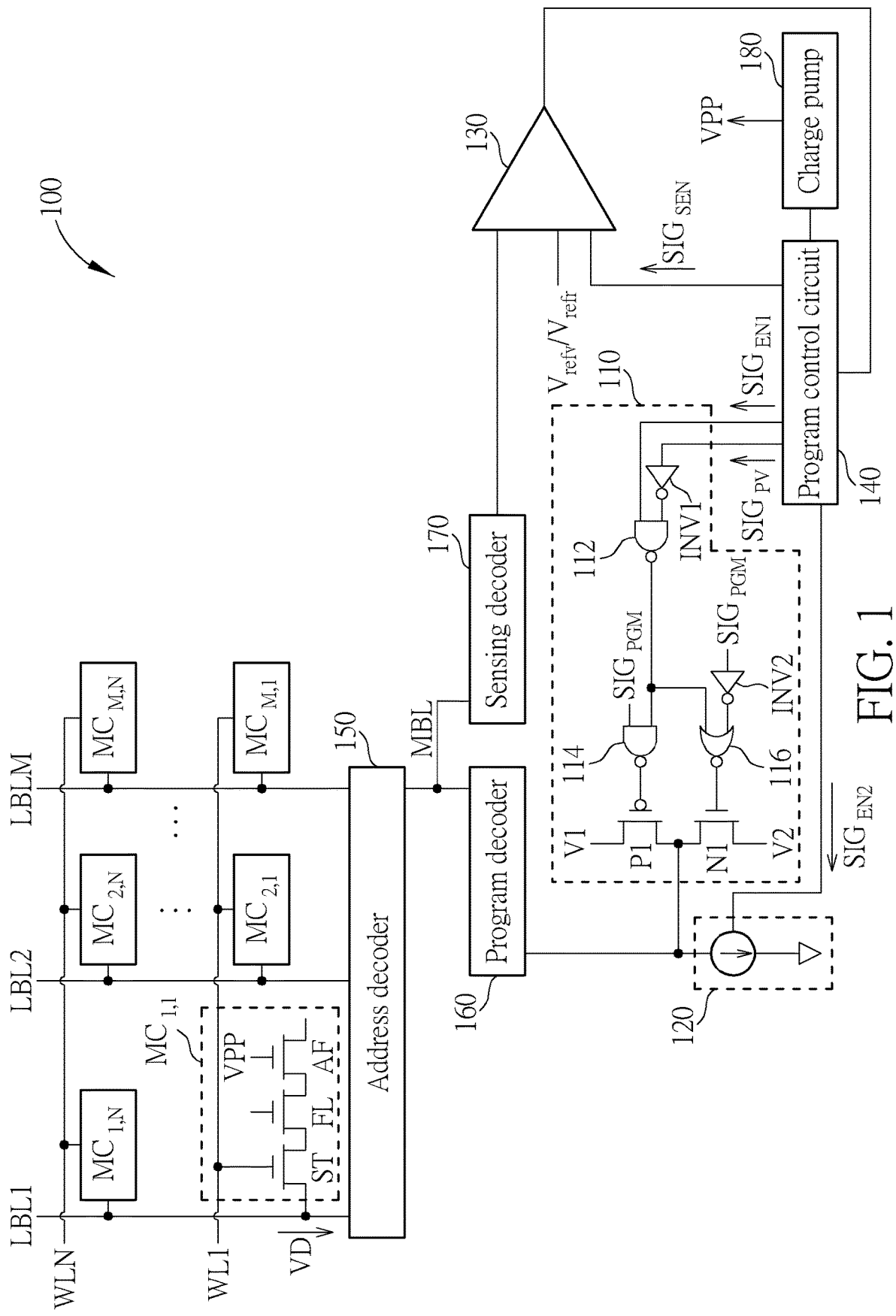
FIG. 1 shows a memory circuit according to one embodiment of the present invention.

FIG. 1 shows a memory circuit 100 according to one embodiment of the present invention. The memory circuit 100 includes a plurality memory cells $MC_{1,1}$ to $MC_{M,N}$, a first program driver 110, a second program driver 120, a sensing amplifier 130, and a program control circuit 140.

The memory cells $MC_{1,1}$ to $MC_{M,N}$ have the same structure, and can be operated with the same principle. For example, the memory cell $MC_{1,1}$ can include a select transistor ST, a following gate transistor FL, and an antifuse transistor AF. The memory cell $M_{1,1}$ can be coupled to a local bit line LBL1 through the select transistor ST controlled by a word line WL1. The following gate transistor FT can be coupled to the select transistor ST and the antifuse transistor AF. In FIG. 1, the memory cells $MC_{1,1}$ to $MC_{1,N}$ are coupled to the same local bit line LBL1. In this case, to perform program operation for each memory cell $MC_{1,1}$ to $MC_{1,N}$ independently, the select transistors ST of the memory cells $MC_{1,1}$ to $MC_{1,N}$ can be used to select the memory cells to be programmed according to the control of the word lines WL1 to WLN.

During the program operation of the memory cell $M_{1,1}$, the antifuse transistor AF can receive a program voltage VPP from its gate, and the select transistor ST and the following gate transistor FL are both turned on, passing a low voltage on the local bit line LBL1 to the antifuse transistor AF. In the present embodiment, the first program driver 110 can be coupled to the local bit line LBL1, and can drive the first local bit line LBL1 to be at the low voltage firmly when being enabled during the program operation of the memory cell $M_{1,1}$.

In FIG. 1, the memory cells $MC_{1,1}$, $MC_{2,1}$, . . . , and $MC_{M,1}$ are coupled to M different local bit lines LBL1 to LBLM. In order to use the same first program driver 110 for driving the different local bit lines LBL1 to LBLM in program operations of different memory cells, the memory circuit 100 can further include an address decoder 150. The address decoder 150 can be coupled to the local bit lines LBL1 to LBLM, and a main bit line MBL. The address decoder 150 can help to form the electrical connection between the selected local bit line and the main bit line MBL, and the first program driver 110, the second program driver 120 and the sensing amplifier 130 can be coupled to the local bit lines LBL1 to LBLM through the main bit line MBL. For example, during the program operation of the memory cell $MC_{1,1}$, the address decoder 150 can form an electrical connection between the local bit line LBL1 and the main bit line MBL. Also, during the program operation of the memory cell $MC_{2,1}$, the address decoder 150 can form an electrical connection between the local bit line LBL2 and the main bit line MBL. Consequently, the first program driver 110 will be able to drive the voltage on the local bit line LBL1 through the main bit line MBL with the address decoder 150 during the program operation of the memory cell $MC_{1,1}$.

In addition, since the first program driver 110, the second program driver 120, and the sensing amplifier 130 may drive or sense the voltages on the local bit lines LBL1 to LBLM during different periods of time, the memory circuit 100 may further include a program decoder 160 for controlling the electrical connections between the program drivers 110 and 120 and the main bit line MBL, and a sensing decoder 170 for controlling the electrical connection between the sensing amplifier 130 and the main bit line MBL.

However, in some embodiments, the memory cells $MC_{1,1}$ to $MC_{M,N}$ may be implemented with different structures and/or different components according to the circuit requirement. Also, the address decoder 150, the program decoder 160 and the sensing decoder 170 can be designed according to the arrangement of the memory cells $MC_{1,1}$ to $MC_{M,N}$ to control the connections among the memory cells $MC_{1,1}$ to $MC_{M,N}$, the address decoder 150, the program decoder 160, and the sensing decoder 170.

In the present embodiment, during the program operation of the memory cell $MC_{1,1}$, the program decoder 160 will form the electrical connection between the first program driver 110 and the main bit line MBL, so the first program driver 110 can drive the voltage at the local bit line LBL1 correspondingly through the program decoder 160, the main bit line MBL and the address decoder 150.

Theoretically, the huge voltage difference between the program voltage VPP and the low voltage applied to the antifuse transistor AF should be high enough to rupture the gate oxide of the antifuse transistor AF, that is, to cause hard breakdown, in a short time, and the memory cell $MC_{1,1}$ can be programmed accordingly. Generally, memory cells being programmed successfully will generate greater gate currents through the ruptured gates than those memory cells that are not being programmed. For example, the gate current generated by a programmed memory cell during program operation may be 300 μA while the gate current generated by a memory cell that has not been programmed to hard breakdown may be merely 100 μA or even smaller.

However, some of the memory cells may need more time to be ruptured and programmed. To verify whether the memory cell $MC_{1,1}$ has been programmed successfully or not, the program control circuit 140 may enable the sensing amplifier 130 to perform the verification.

The sensing amplifier 130 can be coupled to the local bit line LBL1 through the sensing decoder 170 and the main bit line MBL, and can verify whether the memory cell $MC_{1,1}$ has been programmed or not by comparing a verification reference voltage Vrefv and a bit line voltage VD on the local bit line LBL1 caused by the current generated by the memory cell $MC_{1,1}$.

However, if the first program driver 110 is enabled during verification, then the voltage VD on the local bit line LBL1 will be locked at the low voltage due to the strong driving ability of the first program driver 110 even when the memory cell $MC_{1,1}$ is ruptured. That is, the voltage change cause by the gate current will be insignificant, making it difficult for the sensing amplifier 130 to sense. Therefore, to improve the accuracy of the sensing amplifier 130, the first program driver 110 can be disabled when the sensing amplifier 130 is enabled for verification during the program operation of the memory cell $MC_{1,1}$. In this case, the second program driver 120 coupled to the local bit line LBL1 can be enabled to drive the local bit line LBL1 to be close to the low voltage. In some embodiments, the second program driver 120 has a weaker driving ability than the first program driver 110. That is, the second program driver 120 can only drive the local bit line LBL1 to be close to the low voltage, but will not force the local bit line LBL1 to be at the low voltage firmly. In some embodiments, the second program driver 120 can include a current source for providing a small reference current. For example, if the current generated by a programmed memory cell is 300 μA as mentioned, the current generated by the current source of the second program driver 120 can be 150 μA so the verification process performed by the sensing amplifier 130 will not be affected by the second program driver 120 significantly.

Consequently, the voltage VD on the local bit line LBL1 will be able to reflect the change of the current generated by the memory cell $MC_{1,1}$ with a greater variation, so the sensing amplifier 130 can verify if the memory cell $MC_{1,1}$ has been programmed successfully more easily. If the memory cell $MC_{1,1}$ has not been programmed, then the first program driver 110 can be enabled again to keep programing the memory cell $MC_{1,1}$.

In some embodiments, the sensing amplifier 130 can also be used for a read operation. For example, during the read operation of the memory cell $MC_{1,1}$ the sensing amplifier 130 can be enabled to determine the data value stored in the memory cell $MC_{1,1}$ by comparing a read reference voltage Vrefr and the bit line voltage on the local bit line LBL1 coupled to the memory cell $MC_{1,1}$. However, since the voltages applied to the memory cell $MC_{1,1}$ during the read operation would be different from the voltages used in the program operation, the read reference voltage Vrefr may also be different from the verification reference voltage Vrefv.

In FIG. 1, the program control circuit 140 can be coupled to the first program driver 110, the second program driver 120, and the sensing amplifier 130, and can be used to control the first program driver 110, the second program driver 120, and the sensing amplifier 130. For example, during the program operation of the memory cell $MC_{1,1}$, the program control circuit 140 can enable the first program driver 110 and the second program driver 120 so as to program the memory cell $MC_{1,1}$ with strong driving ability. After a predetermined time, then the first program driver 110 will be disabled, and the sensing amplifier 130 can be enabled with the second program driver 120 to verify if the memory cell $MC_{1,1}$ has been programmed successfully.

In some embodiments, if the sensing amplifier 130 verifies that the memory cell $MC_{1,1}$ has been programmed, then the program control circuit 140 can terminate the program operation by disabling the first program driver 110 and the second program driver 120. Furthermore, in some embodiments, the program control circuit 140 can also disable a charge pump 180 which provides the program voltage VPP when terminating the program operation to save even more power.

Otherwise, if the sensing amplifier 130 verifies that the memory cell $MC_{1,1}$ has not been programmed, then the program control circuit 140 can enable the first program driver 110 again. After the first program driver 110 is enabled again, the program control circuit 140 can disable the first program driver 110 and enable the sensing amplifier 130 to perform the verification again. That is, the memory cell $MC_{1,1}$ can be programmed several times until it passes the verification.

Since the verification can be performed during the program operation with the memory cell $MC_{1,1}$ continuously receiving the program voltage VPP, the verification process can be more efficient without external control for the read operations. Furthermore, with the second program driver 120, the accuracy of the verification can also be improved.

In some embodiments, the first program driver 110 can include NAND gates 112, 114, a NOR gate 116, inverters INV1 and INV2, a P-type transistor P1, an N-type transistor N1. The NAND gate 112 has a first input terminal for receiving a first enable signal $SIG_{EN1}$, a second input terminal, and an output terminal. The first inverter INV1 has an input terminal for receiving a program verification signal $SIG_{PV}$, and an output terminal coupled to the second input terminal of the NAND gate 112. The NAND gate 114 has a first input terminal for receiving a program control signal $SIG_{PGM}$, a second input terminal coupled to the output terminal of the NAND gate 112, and an output terminal. The inverter INV2 has an input terminal for receiving the program control signal $SIG_{PGM}$, and an output terminal. The NOR gate 116 has a first input terminal coupled to the output terminal of the NAND gate 112, a second input terminal coupled to the output terminal of the inverter INV2, and an output terminal. The P-type transistor P1 has a first terminal for receiving a first system voltage V1, a second terminal, and a control terminal coupled to the output terminal of the NAND gate 114. The second terminal of the P-type transistor P1 can be coupled to the local bit line LBL1 through the program decoder 160, the main bit line MBL and the address decoder 150 during the program operation of the memory cell $MC_{1,1}$. The N-type transistor N1 has a first terminal coupled to the second terminal of the P-type transistor P1, a second terminal for receiving a second system voltage V2 lower than the first system voltage V1, and a control terminal coupled to the output terminal of the NOR gate 116.

Figure 2:
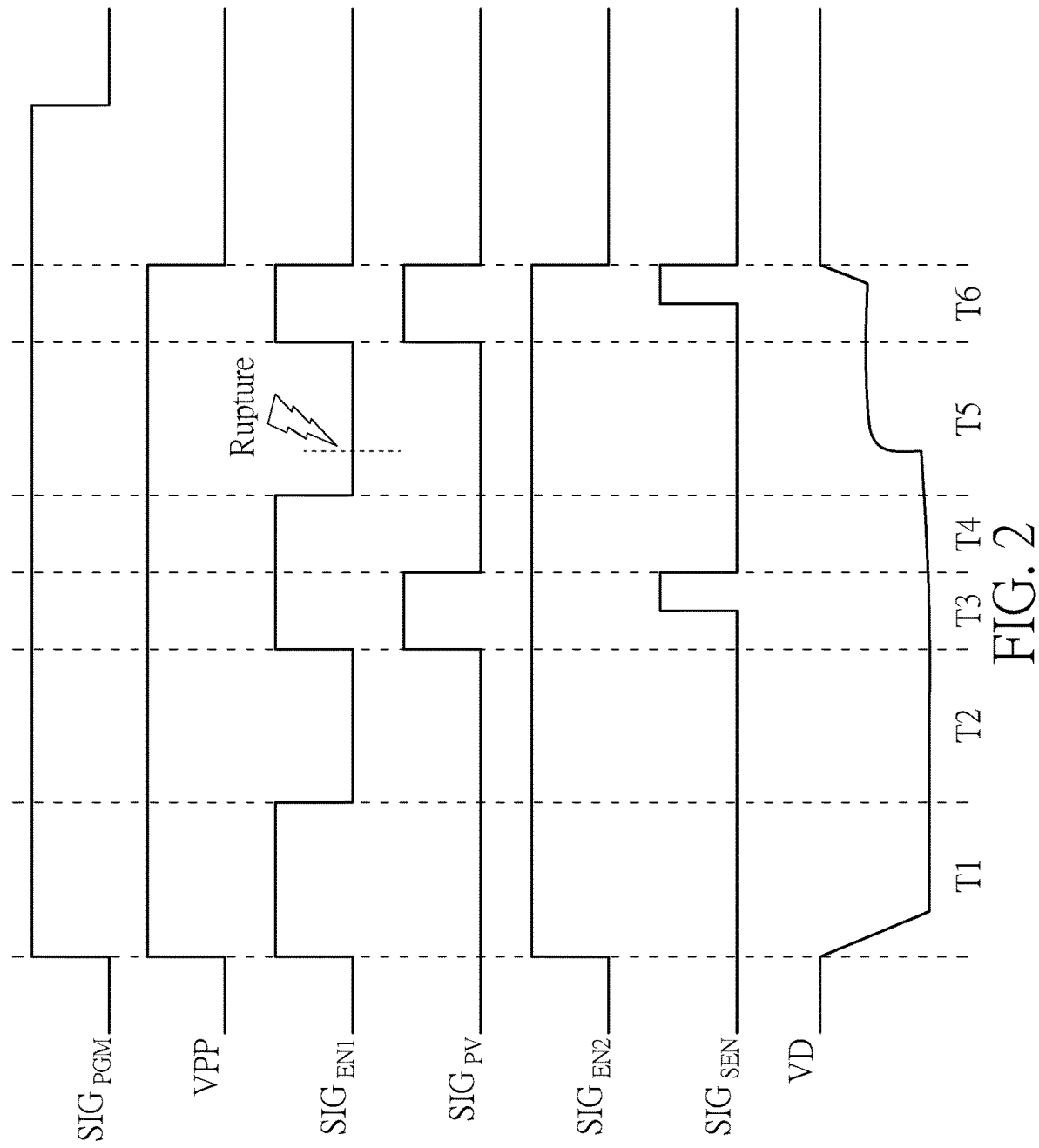
FIG. 2 shows waveforms of the signals of the memory circuit in FIG. 1.

In some embodiments, the first enable signal $SIG_{EN1}$ and the program verification signal $SIG_{PV}$ can be generated by the program control circuit 140, and the program control signal $SIG_{PGM}$ can be issued by an external circuit for initiating the program operation. FIG. 2 shows the waveforms of the signals of the memory circuit 100. In addition, in FIG. 1, the program control circuit 140 can further generate a second enable signal $SIG_{EN2}$ for enabling the second program driver 120. In some embodiments, the current generated by the current source of the second program driver 120 can be determined in advance according to the current generated by a programmed memory cell.

In FIG. 2, the program operation of the memory cell $MC_{1,1}$ begins when the program control signal $SIG_{PGM}$ changes to a high operation voltage. In the beginning period T1 of the program operation, the first enable signal $SIG_{EN1}$ can be at a high operation voltage and the program verification signal $SIG_{PV}$ can be at a low operation voltage. In this case, the NAND gate 114 will output the high operation voltage, turning off the P-type transistor P1. Also, the NOR gate 116 will output the high operation voltage, turning on the N-type transistor N1. Therefore, the first program driver 110 can be enabled to drive the local bit line LBL1 to be at the low voltage. That is, the memory cell $MC_{1,1}$ will be programmed during period T1.

After period T1, the first enable signal $SIG_{EN1}$ can be changed to the low operation voltage, and the program verification signal $SIG_{PV}$ remains at the low operation voltage. In this case, the NAND gate 114 will output the low operation voltage, turning on the P-type transistor P1. Also, the NOR gate 116 will output the low operation voltage, turning off the N-type transistor N1. Therefore, the first program driver 110 can be disabled and stop pulling down the voltage of the local bit line LBL1 during period T2.

In some embodiments, to program the memory cell $MC_{1,1}$ with a smaller voltage during period T2 after the strong program process during period T1 can help the memory cell $MC_{1,1}$ to reach hard breakdown even faster thereby improving the program efficiency. Therefore, during period T2, the second program driver 120 can be enabled. In this case, the memory cell $MC_{1,1}$ will be programmed with a weaker driving ability. That is, the local bit line LBL1 may be at a voltage slightly higher than the low voltage, and thus the voltage applied to the memory cell $MC_{1,1}$ can be reduced. Therefore, the weak program process during period T2 can help to improve the program efficiency. The improvement caused by the weak program process may be even more significant for those memory cells that are more difficult to be programmed, that is, the so-called memory cells of tail bit.

After the weak program process is performed during period T2, the program control circuit 140 can keep disabling the first program driver 110 and can enable the sensing amplifier 130 to perform the verification process during period T3. In the present embodiment, to simplify the generation of the first enable signal $SIG_{EN1}$, the first enable signal $SIG_{EN1}$ can be designed as a clock signal switching between the low operation voltage and the high operation voltage. In this case, to disable the first program driver 110 during the verification process in period T3, the program verification signal $SIG_{PV}$ can have a high voltage pulse when the first enable signal $SIG_{EN1}$ changes from the low operation voltage to the high operation voltage during period T3. In this case, the P-type transistor P1 will be turned on, and the N-type transistor N1 will be turned off so the first program driver 110 will still be disabled.

During period T3, the second program driver 120 can remain enabled, and the gate current generated by the memory cell $MC_{1,1}$ will charge the local bit line LBL1, raising the voltage at the main bit line MBL. In some embodiments, the program control circuit 140 can generate a sensing pulse signal $SIG_{SEN}$ to enable the sensing amplifier 130, and the sensing pulse signal $SIG_{SEN}$ can start after a rising edge of the high voltage pulse of the program verification signal $SIG_{PV}$ and terminate no later than a falling edge of the high voltage pulse of the program verification signal $SIG_{PV}$. That is, the sensing amplifier 130 can compare the bit line voltage VD with the verification reference voltage Vrefv after the voltage at the local bit line LBL1 and the main bit line MBL have been developed for a period of time, so the comparison result can reflect the state of the memory cell $MC_{1,1}$ more accurately.

In some embodiments, the verification process can be shorter than the program process. For example, both periods T1 and T2 can have a duration of 1 µs while period T3 may have a duration of 100 ns.

In FIG. 2, since the verification process during period T3 shows that the memory cell $MC_{1,1}$ has not been successfully programed, the memory cell $MC_{1,1}$ will be programmed again by the first program driver 110 during period T4 after the high voltage pulse has ended and the program verification signal $SIG_{PV}$ has changed to the low operation voltage. Also, the weak program process will be performed during period T5 after the strong program process during period T4. However, in FIG. 2, since the memory cell $MC_{1,1}$ may finally be ruptured during period T5, the bit line voltage VD at the local bit line LBL1 will start to increase and finally become greater than the verification reference voltage Vrefv. Consequently, the verification process performed during period T6 will indicate that the memory cell $MC_{1,1}$ has been successfully programed, and the program control circuit 140 will terminate the program operation.

In some embodiments, the second program driver 120 can be always enabled during the whole program operation to simplify the control scheme. However, in some other embodiments, the second program driver 120 may be disabled when the first program driver 110 is enabled for saving power, and can be enabled when the first program driver 110 is disabled. For example, the second program driver 120 can be disabled during periods T1 and T4 for saving power, and can be enabled during periods T2 and T3.

Furthermore, in some embodiments, to further simplify the control scheme, the weak program process after the strong program process may be omitted. In this case, the first enable signal $SIG_{EN1}$ may remain at the high operation voltage during the program operation, and the first program driver 110 will only be disabled when the program verification signal $SIG_{PV}$ becomes the high operation voltage for performing the verification process.

In addition, in FIG. 2, the program control signal $SIG_{PGM}$ may remain at a high voltage for indicating the program operation, and may not be pulled down right after the program control circuit 140 terminates the program operation by disabling the first program driver 110 and the second program driver 120. This is because the program control signal $SIG_{PGM}$ may be controlled by an external control circuit, such as a processor or a controller, and the duration of the program control signal $SIG_{PGM}$ may have a minimum length according to the design of the external control circuit. However, in some other embodiments, the program control signal $SIG_{PGM}$ may also be generated by the memory circuit 100, and can be pulled down as soon as the program operation is terminated.

Figure 3:
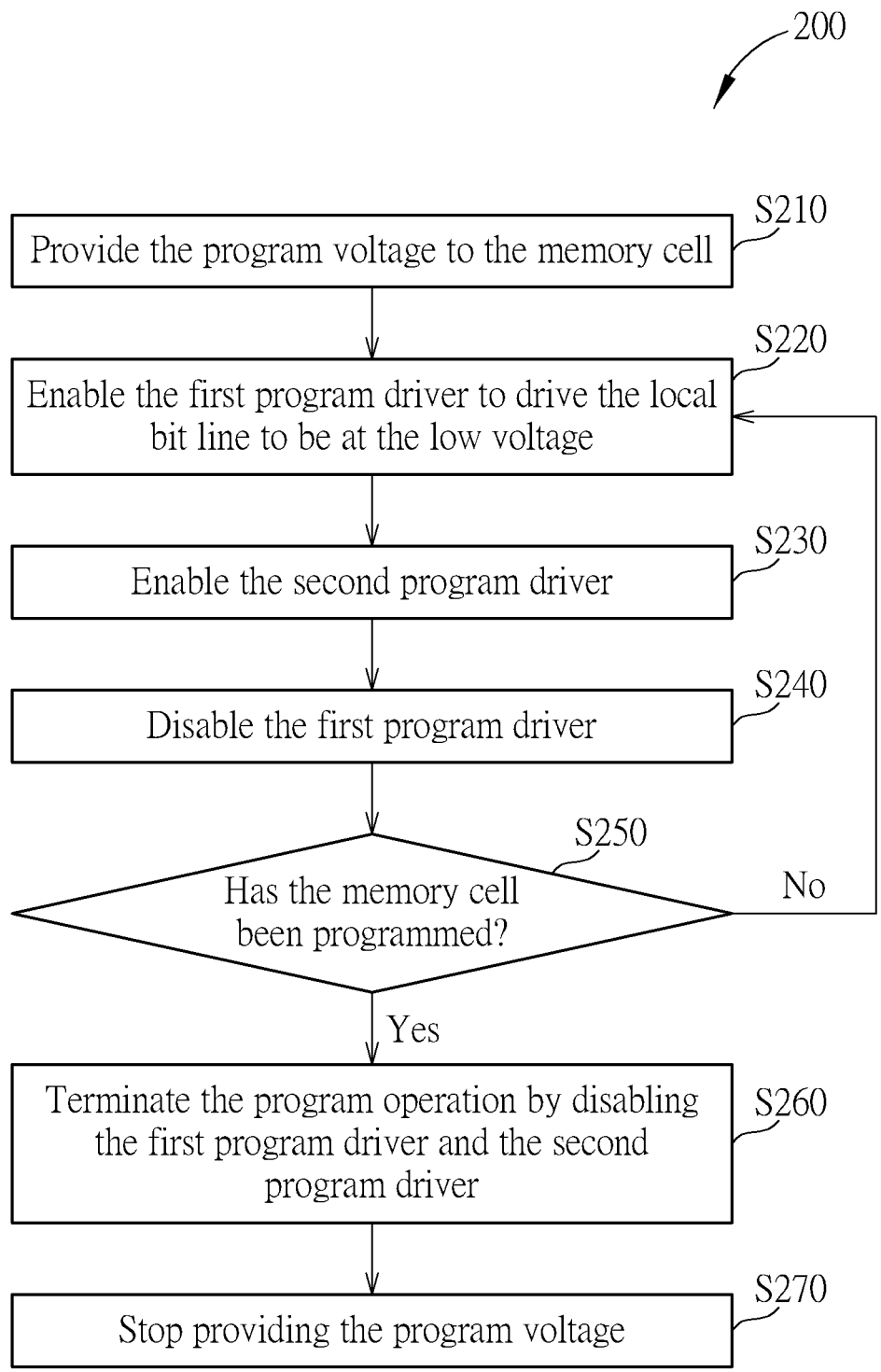
FIG. 3 shows a method for operating the memory circuit in FIG. 1 according to one embodiment of the present invention.

FIG. 3 shows a method 200 for operating the memory circuit 100 according to one embodiment of the present invention. The method 200 can be performed during the program operation of the memory cell $MC_{1,1}$, and the method 200 can include steps S210 to S270.

S210: provide the program voltage VPP to the memory cell $MC_{1,1}$;

S220: enable the first program driver 110 to drive the local bit line LBL1 to be at the low voltage;

S230: enable the second program driver 120;

S240: disable the first program driver 110;

S250: enable the sensing amplifier 130 to verify whether the memory cell $MC_{1,1}$ has been programmed or not; if so, go to step S260; else go to step S220;

S260: terminate the program operation by disabling the first program driver 110 and the second program driver 120;

S270: stop providing the program voltage VPP.

According to the method 200, during the program operation of the memory cell $MC_{1,1}$, the program voltage VPP will be provided and the first program driver 110 will be enabled first in steps S210 and S220 as shown in period T1 shown in FIG. 2. Also, the second program driver 120 can be enabled in step S230. After the memory cell $MC_{1,1}$ has been programmed with the first program driver 110 and the second program driver 120, the first program driver 110 can be disabled in step S240 while the second program driver 120 remains enabled. That is, the memory cell $MC_{1,1}$ can be programmed with the second program driver 120 in step S240 as shown in period T2 in FIG. 2. The weak program process performed in step S240 before the verification process can help to improve the program efficiency. Also, since the verification process is performed with the second program driver 120 having a weaker driving ability, the accuracy of the verification can also be improved.

In step S250, the sensing amplifier 130 is enabled to verify whether the memory cell $MC_{1,1}$ has been programmed or not. After the verification, if the memory cell $MC_{1,1}$ has been programmed successfully, then the program operation will be terminated in step S260, and the charge pump for providing the program voltage VPP can be disabled in step S270 for saving power. However, if the memory cell $MC_{1,1}$ has not been programmed successfully, the steps S220 to S250 will be performed again to program the memory cell $MC_{1,1}$ one more time.

In some embodiments, the second program driver 120 can be always enabled during the whole program operation to simplify the control scheme. However, in some other embodiments, the second program driver 120 may be disabled when the first program driver 110 is enabled for saving power. For example, the second program driver 120 can be disabled when the first program driver 110 is enabled in step S220, and can be enabled when the first program driver 110 is disabled. In this case, steps S230 and S240 can be performed simultaneously.

In summary, the memory circuit and the method for operating the memory circuit provided by the embodiments of the present invention can perform verification during the program operation with a weaker program driver, so the repeated processes of the program operation and the read operation required in prior art can be simplified, saving both of time and the power. Furthermore, the two program processes with different program intensity performed by two program drivers can help the memory cells of tail bit to be programmed faster, further improving efficiency of the program operation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory circuit comprising:
   a first memory cell coupled to a first local bit line, and comprising an antifuse transistor configured to receive a program voltage during a program operation of the first memory cell;
   a first program driver coupled to the first local bit line, and configured to drive the first local bit line to be at a low voltage when being enabled during the program operation of the first memory cell;
   a second program driver coupled to the first local bit line, and configured to drive the first local bit line to be close to the low voltage when being enabled during the program operation of the first memory cell, wherein the second program driver has a weaker driving ability than the first program driver;
   a sensing amplifier coupled to the first local bit line, and configured to verify whether the first memory cell has been programmed or not by comparing a verification reference voltage and a bit line voltage on the first local bit line caused by a current generated by the first memory cell when being enabled during the program operation of the first memory cell; and
   a program control circuit coupled to the first program driver, the second program driver, and the sensing amplifier driver, and configured to:
      enable the first program driver and the second program driver during the program operation;
      disable the first program driver after the first program driver is enabled for a predetermined time; and
      enable the sensing amplifier after the first program driver is disabled during the program operation.

2. The memory circuit of claim 1, wherein the program control circuit is further configured to terminate the program operation by disabling the first program driver and the second program driver when the sensing amplifier verifies that the first memory cell has been programmed.

3. The memory circuit of claim 2, wherein the program control circuit is further configured to disable a charge pump configured to provide the program voltage when the sensing amplifier verifies that the first memory cell has been programmed.

4. The memory circuit of claim 1, wherein the program control circuit is further configured to enable the first program driver again when the sensing amplifier verifies that the first memory cell has not been programmed.

5. The memory circuit of claim 1, wherein the first program driver comprises:
   a first NAND gate having a first input terminal configured to receive a first enable signal, a second input terminal, and an output terminal;
   a first inverter having an input terminal configured to receive a program verification signal, and an output terminal coupled to the second input terminal of the first NAND gate;
   a second NAND gate having a first input terminal configured to receive a program control signal, a second input terminal coupled to the output terminal of the first NAND gate, and an output terminal;
   a second inverter having an input terminal configured to receive the program control signal, and an output terminal;
   a NOR gate having a first input terminal coupled to the output terminal of the first NAND gate, a second input terminal coupled to the output terminal of the second inverter, and an output terminal;
   a P-type transistor having a first terminal configured to receive a first system voltage, a second terminal coupled to the first local bit line, and a control terminal coupled to the output terminal of the second NAND gate; and
   an N-type transistor having a first terminal coupled to the second terminal of the P-type transistor, a second terminal configured to receive a second system voltage lower than the first system voltage, and a control terminal coupled to the output terminal of the NOR gate.

6. The memory circuit of claim 5, wherein:
   the first enable signal and the program verification signal are generated by the program control circuit;
   the first enable signal is a clock signal switching between a low operation voltage and a high operation voltage; and
   the program verification signal has a high voltage pulse when the first enable signal changes from the low operation voltage to the high operation voltage during the program operation of the first memory cell.

7. The memory circuit of claim 6, wherein:
   the program control circuit further generates a sensing pulse signal to enable the sensing amplifier; and
   the sensing pulse signal starts after a rising edge of the high voltage pulse of the program verification signal and terminates no later than a falling edge of the high voltage pulse.

8. The memory circuit of claim 1, wherein the second program driver comprises a current source.

9. The memory circuit of claim 1, wherein:
   the sensing amplifier is further configured to determine a data value stored in the first memory cell by comparing a read reference voltage and the bit line voltage on the first local bit line when being enabled during a read operation of the first memory cell.

10. The memory circuit of claim 1, further comprising:
    a second memory cell coupled to a second local bit line, and comprising a antifuse transistor configured to receive the program voltage during a program operation of the second memory cell; and
    an address decoder coupled to the first local bit line, the second local bit line, and a main bit line, and configured to form an electrical connection between the first local bit line and the main bit line during the program operation of the first memory cell, and form an electrical connection between the second local bit line and the main bit line during the program operation of the second memory cell;
    wherein the first program driver and the second program driver are coupled to the first local bit line and the second local bit line through the main bit line.

11. The memory circuit of claim 1, wherein the second program driver remains enabled during the program operation after being enabled.

12. The memory circuit of claim 1, wherein the second program driver is enabled when the first program driver is disabled during the program operation, and is disabled when the first program driver is enabled.

* * * * *